United States Patent
Rauf et al.

(10) Patent No.: US 7,988,815 B2
(45) Date of Patent: Aug. 2, 2011

(54) PLASMA REACTOR WITH REDUCED ELECTRICAL SKEW USING ELECTRICAL BYPASS ELEMENTS

(75) Inventors: Shahid Rauf, Pleasanton, CA (US); Kenneth S. Collins, San Jose, CA (US); Kallol Bera, San Jose, CA (US); Kartik Ramaswamy, San Jose, CA (US); Hiroji Hanawa, Sunnyvale, CA (US); Andrew Nguyen, San Jose, CA (US); Steven C. Shannon, San Mateo, CA (US); Lawrence Wong, Fremont, CA (US); Satoru Kobayashi, Mountain View, CA (US); Troy S. Detrick, Los Altos, CA (US); James P. Cruse, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 996 days.

(21) Appl. No.: 11/828,568

(22) Filed: Jul. 26, 2007

(65) Prior Publication Data
US 2009/0025878 A1 Jan. 29, 2009

(51) Int. Cl.
*C23C 16/00* (2006.01)
*H01L 21/306* (2006.01)

(52) U.S. Cl. ......... 156/345.43; 156/345.47; 156/345.48; 118/723 R; 118/723 E; 118/723 I

(58) Field of Classification Search ............... 118/723 E, 118/723 ER, 723 R, 728, 723 I, 723 IR, 723 AN; 156/345.43, 345.46, 345.47, 345.48, 345.49
See application file for complete search history.

(56) References Cited

U.S. PATENT DOCUMENTS

| | | | | |
|---|---|---|---|---|
| 5,210,466 A | * | 5/1993 | Collins et al. | 315/111.21 |
| 5,215,619 A | * | 6/1993 | Cheng et al. | 156/345.42 |
| 5,891,350 A | * | 4/1999 | Shan et al. | 216/71 |
| 6,178,919 B1 | | 1/2001 | Li et al. | 118/723 E |
| 6,296,747 B1 | | 10/2001 | Tanaka | 204/298.07 |
| 6,673,196 B1 | * | 1/2004 | Oyabu | 156/345.31 |
| 2004/0083977 A1 | | 5/2004 | Brown et al. | 118/728 |
| 2004/0159286 A1 | | 8/2004 | Aoki et al. | 118/723 |
| 2007/0158027 A1 | | 7/2007 | Aoki et al. | 156/345.43 |
| 2008/0187682 A1 | * | 8/2008 | Park et al. | 427/569 |
| 2008/0274297 A1 | * | 11/2008 | Furuta et al. | 427/569 |

FOREIGN PATENT DOCUMENTS

KR 2003-0083729 10/2003

OTHER PUBLICATIONS

U.S. Appl. No. 11/828,713, Rauf et al.
Official Action Dated Feb. 1, 2011 Issued in Co-Pending U.S. Appl. No. 11/828,713.

* cited by examiner

Primary Examiner — Luz L. Alejandro
(74) Attorney, Agent, or Firm — Robert M. Wallace

(57) ABSTRACT

RF ground return current flow is diverted away from asymmetrical features of the reactor chamber by providing bypass current flow paths. One bypass current flow path avoids the pumping port in the chamber floor, and comprises a conductive symmetrical grill extending from the side wall to the grounded pedestal base. Another bypass current flow path avoids the wafer slit valve, and comprises an array of conductive straps bridging the section of the sidewall occupied by the slit valve.

19 Claims, 8 Drawing Sheets

PLASMA REACTOR WITH REDUCED ELECTRICAL SKEW USING ELECTRICAL BYPASS ELEMENTS

TECHNICAL FIELD

The disclosure related to plasma reactors and in particular plasma reactors for processing a workpiece such as a semiconductor wafer.

BACKGROUND

Plasma reactors are used in processing a workpiece such as a semiconductor wafer in various plasma processes such as plasma etch processes, plasma deposition processes and plasma immersion ion implantation, for example. Reduction in semiconductor device feature size has required improvement of plasma reactors and processes to reduce non-uniformities in plasma processing results. For example, in plasma etch processes, radial distribution of etch rate across the wafer has been successfully reduced below about 5%. As device feature size continues to shrink to 45 nm and then to 32 nm, further improvement in plasma uniformity is needed.

SUMMARY

Embodiments of the present invention pertain to an apparatus and method that can be used for processing a semiconductor workpiece (e.g., a wafer) with enhanced plasma uniformity. In one aspect, a plasma reactor is provided for processing a workpiece. The reactor includes a vacuum chamber having a cylindrical side wall, a ceiling and a floor. A workpiece support pedestal in the chamber defines a pumping annulus between the pedestal and the side wall, the workpiece support pedestal having a grounded surface adjacent the floor. An RF power applicator couples RF power into a process zone defined between the ceiling and the pedestal. A vacuum pump is coupled to the chamber through a pumping port through the floor. The reactor further includes a dielectric element between the grounded surface of the pedestal and the floor. The reactor also includes an annular conductive grill in the pumping annulus that is displaced above the floor by a grill-to-floor gap. The grill provides a uniform current path from the side wall to the grounded surface of the pedestal. The grill is generally symmetrical relative to an axis of symmetry of the chamber.

In one embodiment, the reactor further includes a slit valve opening through a circumferential portion of the cylindrical side wall, the slit valve being axially confined within an annular section of the cylindrical side wall. At least a first dielectric ring is disposed in the cylindrical side wall adjacent an axial boundary of the annular section of the side wall. An array of conductive straps provide axial current paths bypassing the annular section of the cylindrical side wall. Each of the conductive straps has a pair of ends, one end being electrically connected to the side wall above the annular section and the other end being electrically connected to the side wall below the annular section. In one embodiment, the straps are routed to avoid blocking access to the slit valve opening.

In one embodiment, a second dielectric ring is disposed in the cylindrical side wall, the first dielectric ring being adjacent a top axial boundary of the annular section of the side wall and the second dielectric ring being adjacent a bottom axial boundary of the annular section of the side wall. In a further embodiment, the straps are periodically spaced around the circumference of the side wall at uniform intervals, and the straps are configured to provide uniform inductances to RF current. The straps adjacent the slit valve are of a sufficient length to permit routing around a periphery of the slit valve, while the remaining straps are of a shorter length.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

We have discovered that azimuthal skew in the electrical field in a plasma reactor may be a limiting factor in reducing plasma process non-uniformity below 3%. Such azimuthal skew arises from asymmetrical features of the plasma reactor itself. These asymmetrical features may create non-uniformities in the RF ground return currents through the chamber walls and floor. Such non-uniformities may be reflected in the electrical field distribution at the wafer surface, which contributes to process non-uniformities. For example, in a certain reactor chamber, the chamber is evacuated at the bottom of its pumping annulus through a pumping port which is generally a circular opening in the floor of the pumping annulus. Another example is in some reactor chamber, a wafer slit valve is provided and the wafer slit valve in the cylindrical chamber sidewall that extends around about one quarter of the circumference of the cylindrical side wall. These features may cause discontinuities in the conductive floor and wall of the chamber, forcing RF ground return currents to distribute in a non-uniform manner, giving rise to azimuthal skews in the electrical field at the wafer surface. These skews represent a 1% to 2% non-uniformity in plasma processing results on the wafer.

Embodiments of the present invention pertain to providing a current flow path so that in one embodiment, RF ground return current flow is diverted away from asymmetrical features of the reactor chamber by providing bypass current flow paths. One bypass current flow path avoids the pumping port in the chamber floor, and comprises a conductive symmetrical grill extending from the side wall to the grounded pedestal base. Another bypass current flow path avoids the wafer slit valve, and comprises an array of conductive straps bridging the section of the sidewall occupied by the slit valve.

Figure 1:
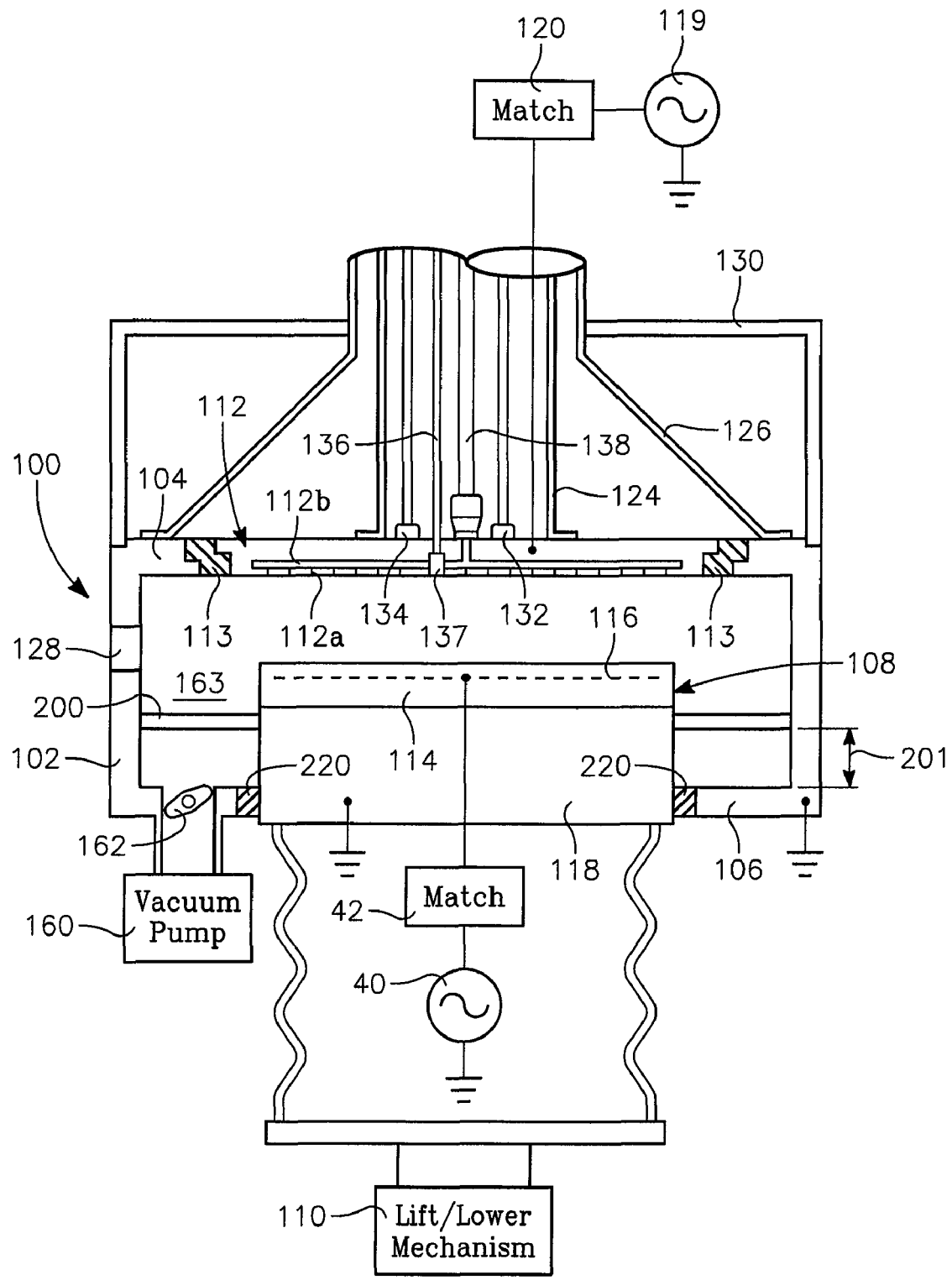
FIG. 1 illustrates an embodiment in which a raised conductive grill is disposed over the floor of a plasma reactor chamber.

Referring to FIG. 1, a plasma reactor includes a chamber 100 enclosed by a cylindrical side wall 102, a ceiling 104 and a floor 106. A wafer support pedestal 108 extends through the floor and may be movable along the vertical axis by a lift mechanism 110. An overhead RF power applicator couples RF power into the interior of the chamber 100. In the example of FIG. 1, the overhead RF power applicator is an electrode 112 in the ceiling 104. The electrode 112 is electrically insulated from the ceiling 104 by a dielectric ring 113. In another embodiment, the overhead RF power applicator is a coil antenna (not shown) overlying the ceiling or placed around the side wall 102. The wafer support pedestal 108 may have a top dielectric section 114 enclosing a cathode electrode 116, and a bottom conductive base 118 that is connected to RF ground. RF plasma power is applied to the overhead electrode 112 from an RF generator 119 through an RF impedance match 120. The RF impedance match 120 may be a coaxial tuning stub (not shown). The RF feed structure to the overhead electrode 112 may be coaxial, including a hollow circular center conductor 124 and a hollow circular outer conductor 126 that is coaxial with the inner conductor 124. The hollow center conductor 124 is connected to the overhead electrode 112 and to the RF hot output of the impedance match 120. The outer conductor is connected to RF ground and to the grounded portion of the ceiling. The coaxial feed structure 124 and 126 may be integrated with the coaxial tuning stub. A slit valve 128 that facilitates wafer ingress and egress is formed as a shallow opening through the side wall 102, the opening extending around about one quarter of the circumference of the side wall 102, as shown in the top view of FIG. 2. RF power is coupled to the cathode electrode 116 from an RF generator 40 through an RF impedance match 42. The chamber 100 is evacuated by a vacuum pump 160 through a pumping port 162 in the chamber floor. A pumping annulus 163 is defined between the wafer support pedestal 108 and the side wall 102.

In one embodiment, all facility lines to the overhead electrode 112 are enclosed by a conductive cylindrical hollow can 130, including a coolant inlet line 132, a coolant outlet line 134, an optical sensor line 136 coupled to a sensor 137 (such as an optical emission spectroscopy sensor), and process gas supply line(s) 138. In the embodiment depicted in FIG. 1, the overhead electrode 112 is also a gas distribution showerhead containing plural gas injection orifices 112a and an internal process gas manifold 112b. The gas supply line 138 is coupled to the internal gas manifold 112b. The overhead electrode 112 can have internal coolant jackets (not shown) in which coolant is circulated from the inlet 132 and returned to the outlet 134. In the embodiment depicted in FIG. 1, all the facility lines 132, 134, 136, 138 are not only inside the can 130 but are also inside the center coaxial conductor 124.

During plasma processing, process gas injected by the overhead electrode/showerhead 112 is ionized by the RF power coupled into the chamber 100, to form a plasma in a processing zone between the ceiling electrode 112 and the wafer support 108. RF current from the plasma is returned to ground by flowing from the plasma to sidewall 102 and top electrode 112. The current flows to the side wall 102, and then downward along a surface of the side wall 102 to the perimeter of the floor 106, and radially inwardly along the floor 106 to the grounded base 118 of the wafer support pedestal 108.

Figure 2:
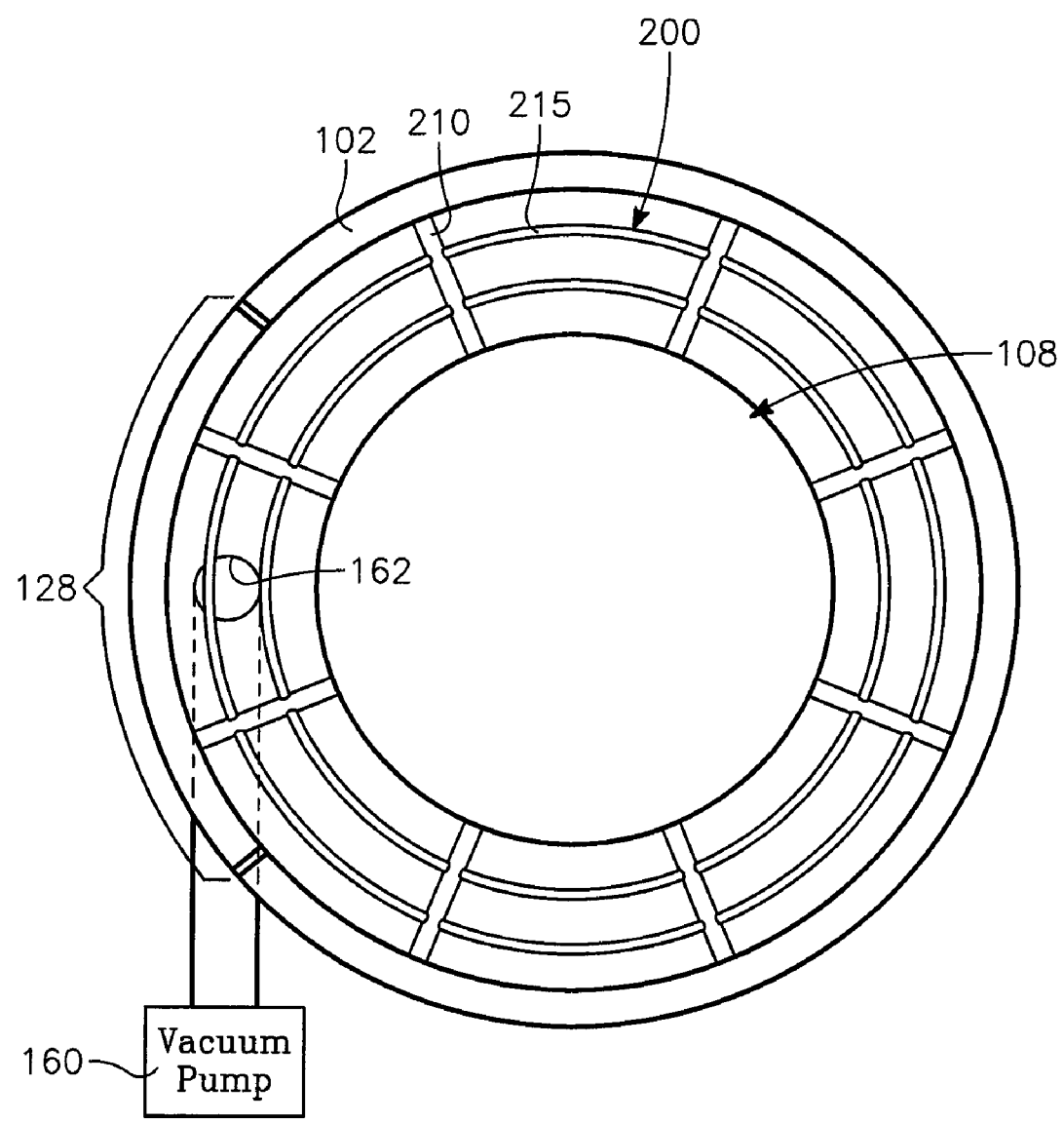
FIG. 2 is a top view corresponding to FIG. 1.

While the reactor of FIGS. 1 and 2 is symmetrical in general and therefore promotes uniform or symmetrical process conditions around the wafer support pedestal 108, certain features such as the slit valve 128 and the pumping port 162 are discontinuities in the axially downward RF current return path along the side wall 102 and along the radial path from the edge of the floor to the grounded base of the wafer support pedestal. This may make the electrical field distribution non-uniform, such non-uniformity affecting the electric field not only at the bottom of the chamber but also at the surface of a wafer supported on the pedestal. Such non-uniformity could introduce a 2% non-uniformity in plasma processing results, such as the distribution of etch rate across the surface of the wafer.

In one embodiment, a raised conductive grill 200 having complete symmetry (and no asymmetrical discontinuities) is provided in the pumping annulus 163. The conductive grill 200 can eliminate the discontinuity of the pumping port 162 as a source of azimuthal skew in the RF ground return current path, by presenting an alternative current path free of asymmetries. The conductive grill 200 is supported above the floor 106 with a floor-to-grill gap 201 that is sufficiently long for gas flow through the grill 200 to smoothly flow to the pumping port 162 within the gap 201. The gap 201 is also sufficiently long to prevent appreciable capacitive coupling between the grill 200 and the floor 106 at the frequency of the RF generator 119 or the frequency of the RF generator 40.

The conductive grill 200 provides an electrical path from the conductive side wall 102 to the grounded base 118 of the wafer support pedestal 108. As illustrated in FIG. 2, the grill 200 has a uniformly and symmetrically distributed pattern of conductive spokes 210 and circular conductors 215, and therefore provides a ground return path from the side wall 102 to the ground pedestal base 118 that is free of any azimuthal skew, non-uniformities or asymmetries. In one embodiment, to ensure that all ground return current flows through the conductive grill 200, the conductive chamber floor 106 is electrically isolated from the pedestal base 118 by a dielectric ring 220 (FIG. 1). The radial thickness of the ring 220 is sufficient to prevent capacitive coupling at the frequency of the RF generator 119 and at the frequency of the RF generator 40. The grill pattern with the spokes 210 and conductors 215 of the grill 200 leaves sufficient open space to minimize gas flow resistance from the chamber 100 to the pump 160. Specifically, the ratio of the horizontal area occupied by the spokes 210 and circular conductors 215 to the total area occupied by the grill is sufficiently small to minimize gas flow resistance through the grill 200. On the other hand, this ratio is sufficiently great (the grill spacing is sufficiently small) to avoid a grill pattern in the RF ground return current flow from manifesting itself in the electric field at the wafer surface (at the top surface of the workpiece support pedestal 108). For this purpose, the spacing between spokes 210 is much less than the axial distance between the top surface of the wafer support pedestal 108 and the grill 200. Specifically, for example, the ratio between the maximum spacing between spokes 210 and the space between the top of the pedestal 108 and the grill 200 is about three or more.

Figure 3:
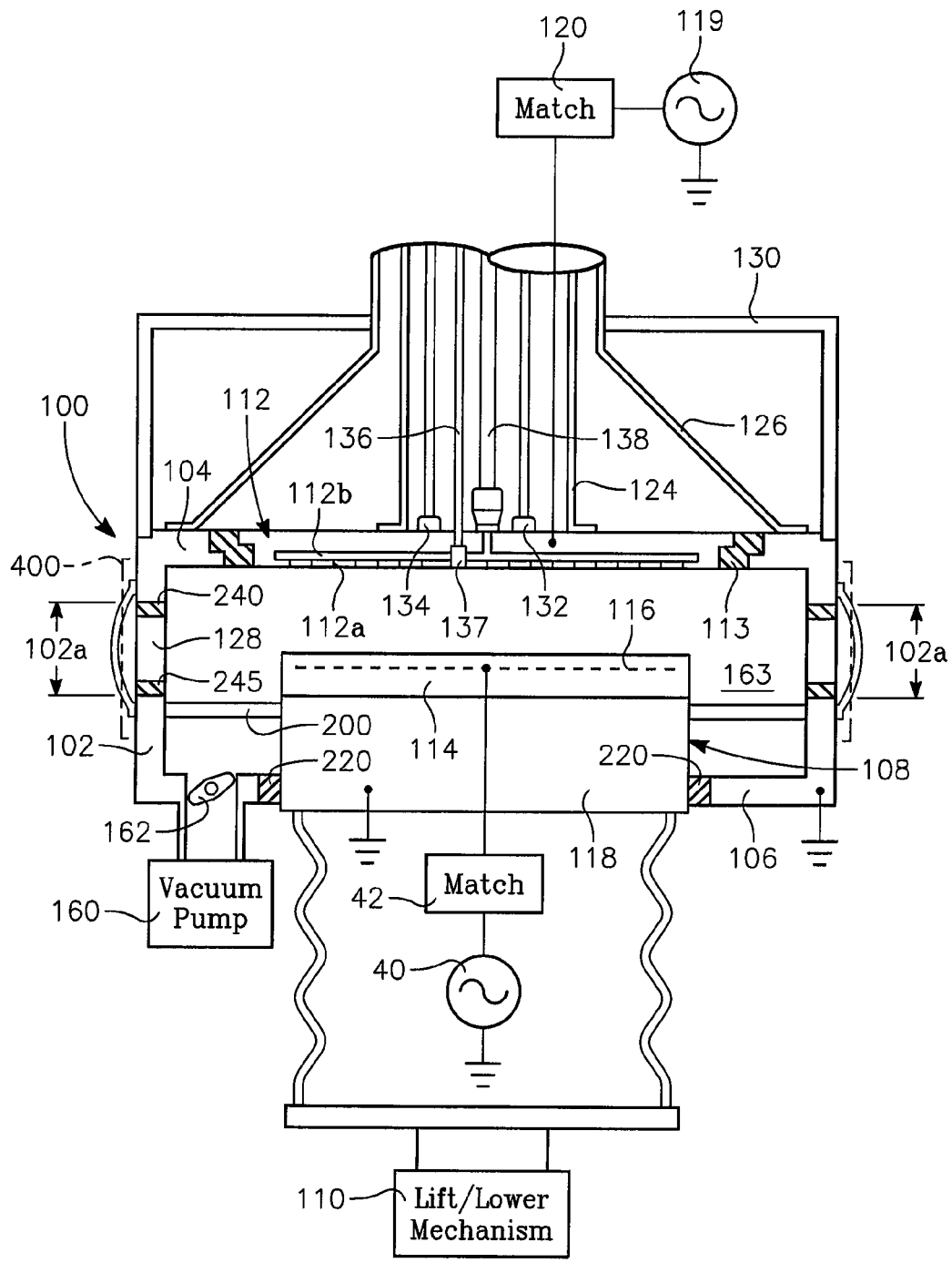
FIG. 3 illustrates an embodiment in which plural conductive straps provide a bypass current path around the slit valve of a plasma reactor.
Figure 4:
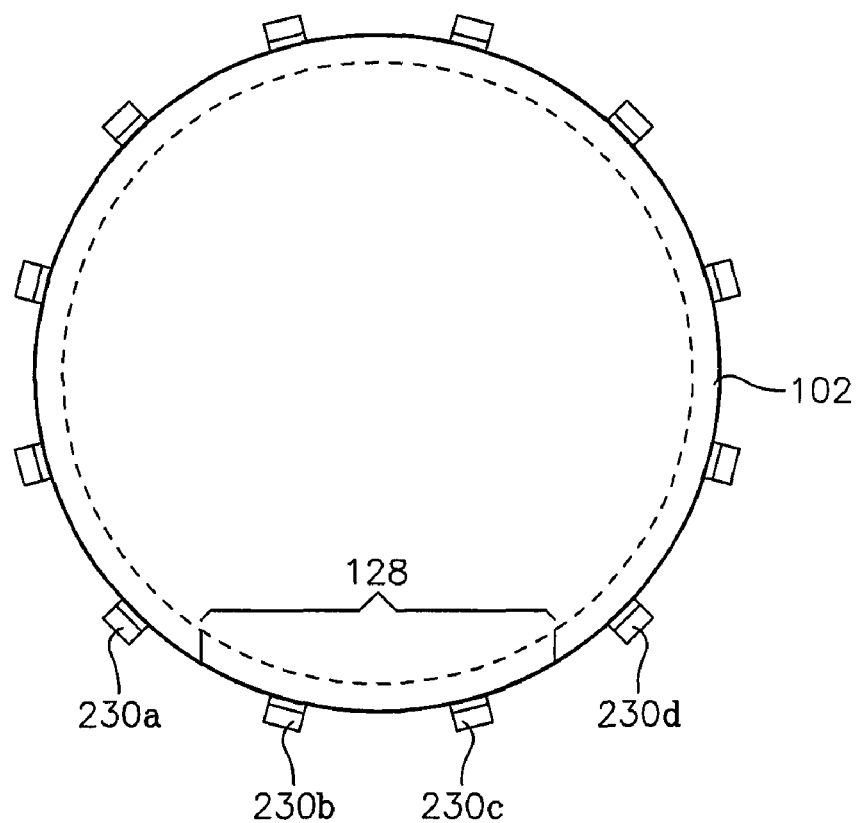
FIG. 4 is a top view corresponding to FIG. 3.

In another embodiment (as illustrated in FIG. 3), upper and lower insulating rings 240, 245 above and below the slit valve 128 are provided in the side wall 102. In one embodiment, a current path bypassing the electrically isolated sidewall section 102a is provided by plural conductive straps 230 connected axially across the isolated section 102a as illustrated in FIG. 4. The insulating rings 240, 245 can eliminate the discontinuity presented by the slit valve 128 as a source of azimuthal skew in the ground return path current distribution.

Figure 5:
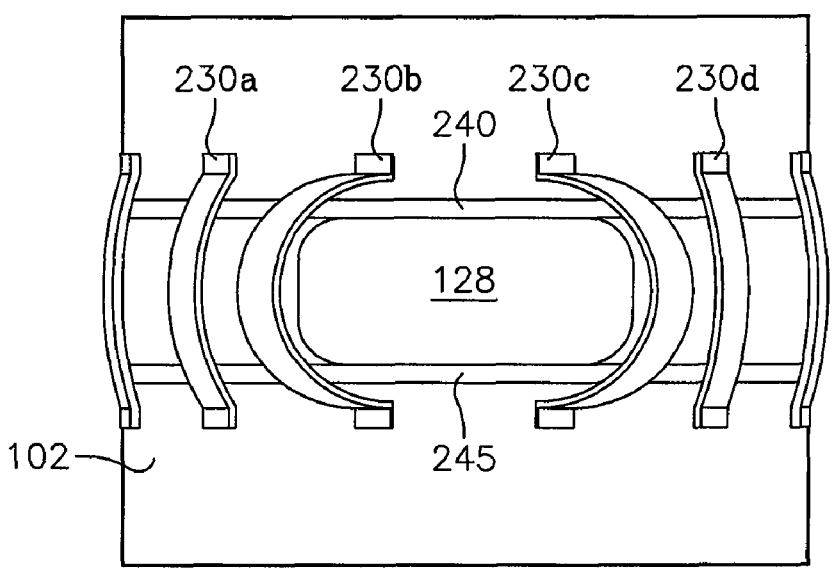
FIG. 5 is a corresponding side view.

The ground return path provided by the conductive straps 230 bypasses the section of the side wall 102 occupied by the slit valve. This bypass current path is symmetrically distributed around the chamber. The RF ground return current is blocked from flowing in the section 102a of the side wall 102 occupied by the slit valve 128 by the upper insulating ring 240 and a lower insulating ring 245 above and below, respectively, the side wall section 102a of the slit valve 128, as shown in FIG. 3. At least one if not both of the dielectric rings 240, 245 is present. In one embodiment, the plural conductive straps 230 are placed at uniform intervals around the side wall 102 and have a uniform length, width and thickness, as shown in FIG. 4. The straps 230 are sufficiently long so that those straps 230a, 230b, 230c, 230d coinciding with the slit valve 128 run in paths that circumvent the front of the slit valve 128 so as to not interfere with wafer ingress and egress, as shown in FIG. 5. In an alternative embodiment, the straps have a length more closely corresponding with the axial length of the isolated sidewall section 102a which they span, with the exception of the straps 230a-230d which must be routed around the slit valve 128, which are correspondingly longer. In one embodiment, to avoid a non-uniform current distribution arising from such differences in strap length, the straps are all provided with a uniform (or approximately uniform) inductance. In this case, the longer straps 230a-230d have a different width and thickness than the remaining (shorter) straps, the differences in width and thickness being selected to provide the same inductance for both lengths of straps. This is accomplished by constraining the following equation to yield the same inductance for the two different lengths:

$$L = 0.0002 l \left[ \log_e \left( \frac{2l}{B+C} \right) + \frac{1}{2} \right] \quad \text{Equation (1)}$$

Where L is inductance in µH, l is strap length in cm, B is strap width in cm, and C is strap thickness in cm.

The spacing d between adjacent straps 230 presents a discontinuity in the ground return current path distribution. In one embodiment, to avoid the strap spacing pattern from imposing a like pattern in the electric field at the top of the wafer support pedestal 108, the strap-to-strap spacing is much less than the distance from the top of the slit valve 128 to the top of the wafer pedestal 108, by a factor of about 3, for example. The spacing between adjacent straps 230 is determined by the width of the straps 230 and the number of periodically spaced straps. The number of straps is at least 4 and may be as great as ten or more. The strap width may be about one tenth of the circumference of the cylindrical side wall 102, for example.

In one embodiment, an insulating member 400 (FIG. 3) may be provided on the sidewall 102. The insulating member surrounds the slit valve 128 in the present embodiment. The insulating member 400 may be a dielectric material bonded to the surface of the cylindrical side wall. In one embodiment, the insulating member 400 prevents shorting across the side wall section 102a occupied by the slit valve that may occur when the slit valve 128 interfaces with the port of an external wafer transfer chamber (not shown), for example.

In one embodiment, the elevated conductive grill 200 and the array of periodically spaced conductive straps 230 are included together in the same reactor, as depicted in FIG. 3. This combination reduces or eliminates azimuthal skews in the workpiece electric field attributable to the RF ground return current path discontinuities of the pumping port 162 and the slit valve 128. Other skews or non-uniformities in the workpiece electrical field attributable to facilities supplied to the overhead electrode 112 are avoided by containing all such facilities supply lines within the cylindrical conductive can 130.

Figure 6:
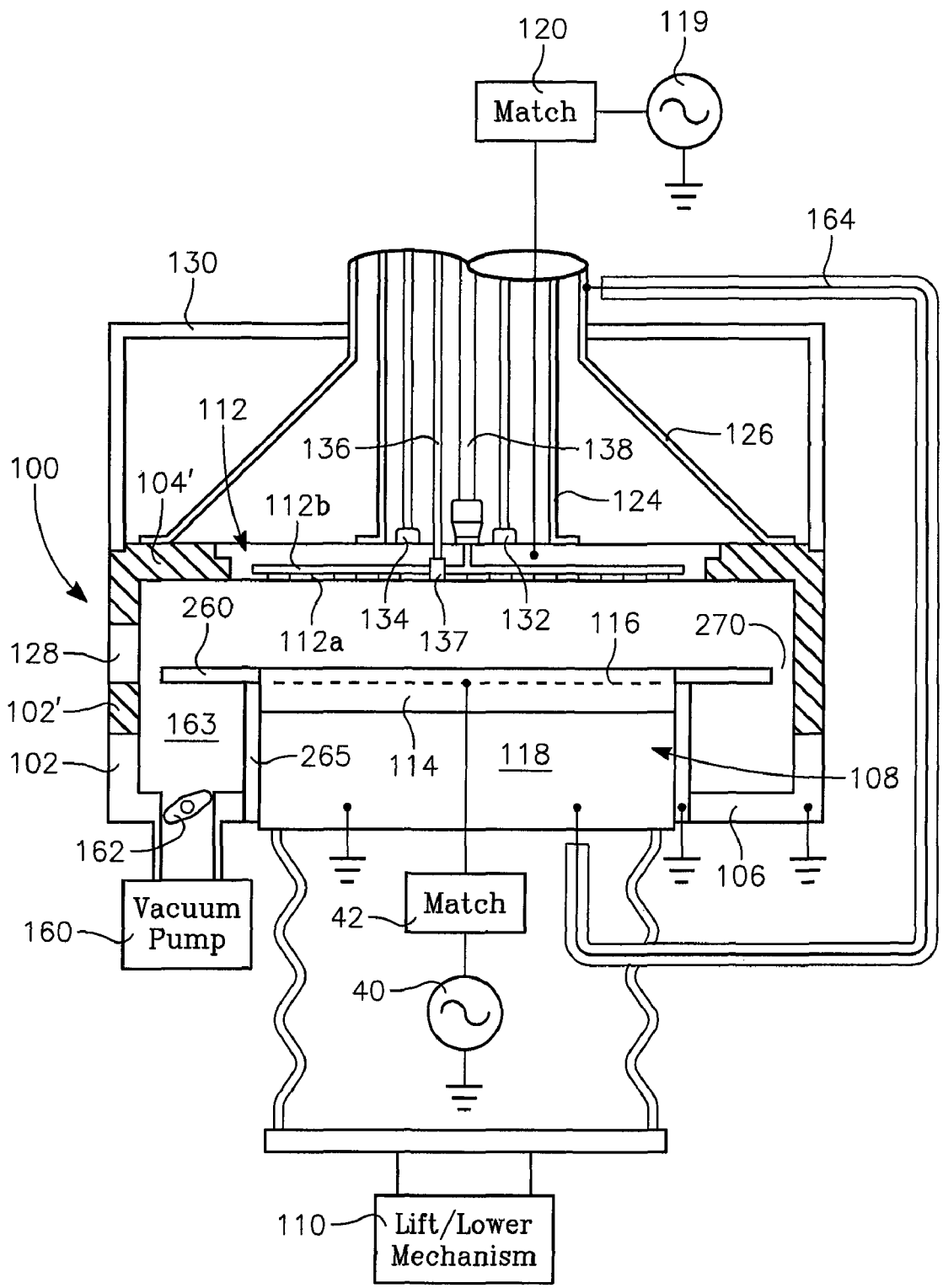
FIG. 6 illustrates a plasma reactor in accordance with another embodiment having a dielectric chamber body and a grounded conductive flange around the pedestal.

In another embodiment, as illustrated in FIG. 6, an upper portion of the conductive chamber sidewall 102 is replaced by a dielectric sidewall portion 102'. The entire ceiling 104 is replaced by a dielectric ceiling 104', as shown in FIG. 6. The dielectric sidewall portion 102' extends downwardly from the ceiling 104' to depth above which plasma tends to be confined. This feature can prevent RF ground return currents from flowing through the sidewall 102 and the floor 106. As a result, the discontinuities of the slit valve 128 and pumping port 162 have no effect upon the electric field. In the embodiment of FIG. 6, a different path is provided for RF ground return current from the plasma by a conductive annular baffle 260 that is grounded to an outer conductive liner 265 of the workpiece support pedestal. The baffle 260 is at the level where it is in contact with the plasma sheath, and can conduct the RF ground return current from the plasma. The liner 265 itself is grounded to the pedestal base 118. A radial gap 270 between the baffle 260 and the side wall 102 permits gas flow from the processing region above the pedestal into the pumping annulus 163. Because the dielectric sidewall portion 102' blocks current flow between the top and bottom portions of the chamber, the outer coaxial conductor 126 needs to be grounded to the bottom of the chamber, namely to the pedestal base 118. This may be accomplished by connecting the inner conductor 164 of a coaxial cable between the outer coaxial conductor 126 and the grounded base 118.

Figure 7:
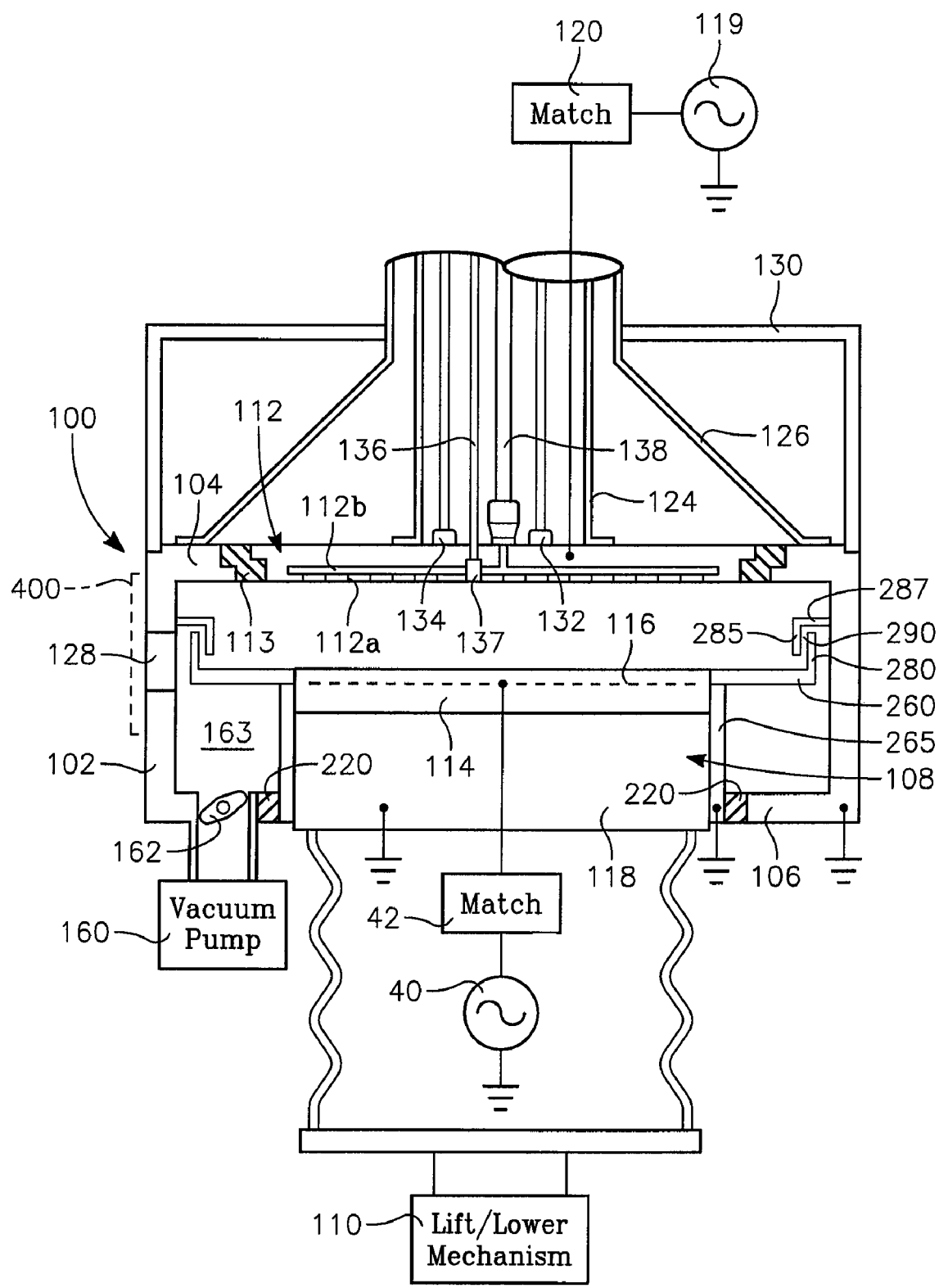
FIG. 7 illustrates a plasma reactor in accordance with a further embodiment having a conductive chamber body and a grounded conductive flange on the pedestal and electrically coupled to the side wall.
Figure 8:
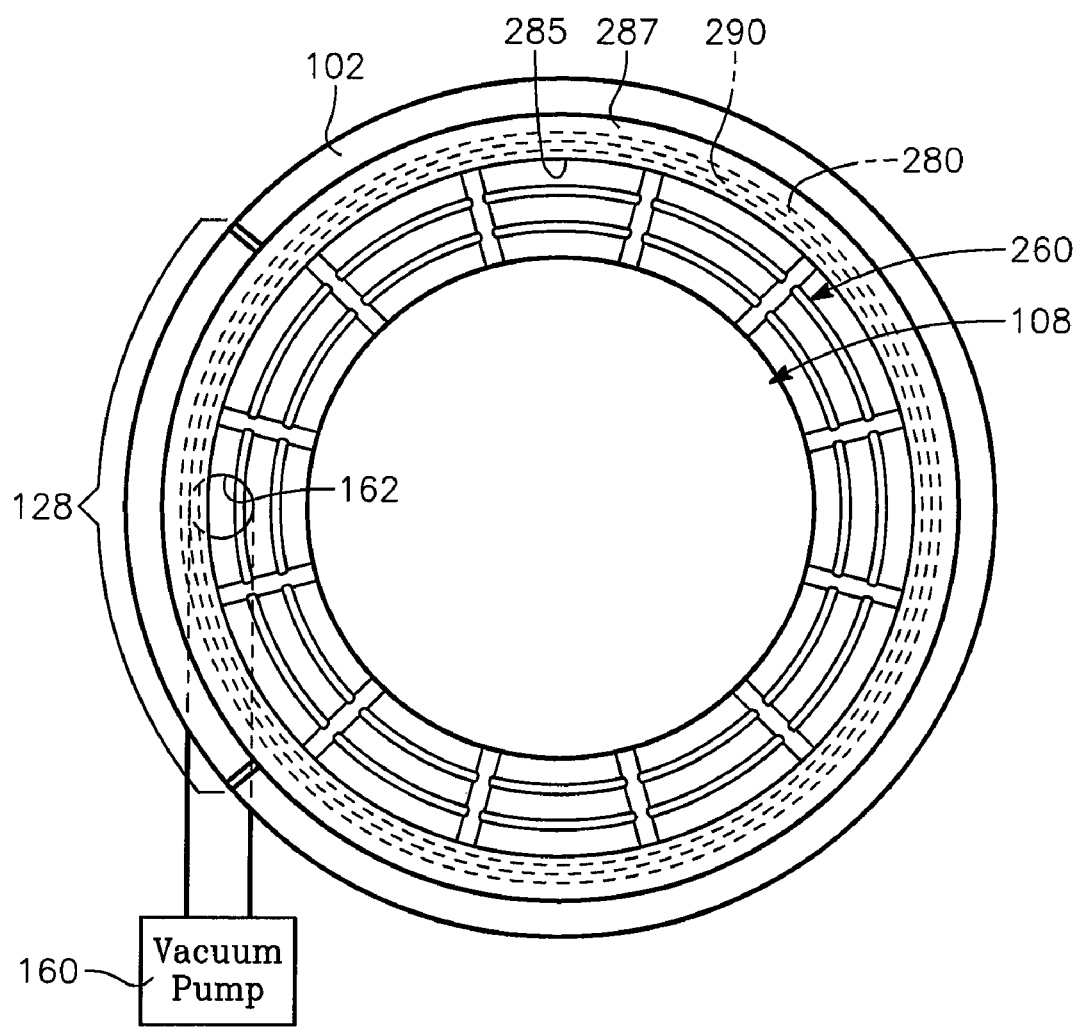
FIG. 8 is a top view corresponding to FIG. 7.

A more economic approach is to retain the entirely conductive side wall 102 of FIG. 1, but also provide the baffle 260 of FIG. 6. One implementation of this combination is depicted in FIGS. 7 and 8, in which the baffle 260 spans at least nearly the entire distance between the pedestal 108 and the side wall 102. The baffle 260 of FIG. 7 is gas permeable, and may be formed as a gas-permeable grill, for example. Alternatively, the gas permeable feature of the baffle 260 may be implemented by forming an array of axial holes through the baffle 260. The gas permeable characteristic of the baffle 260 permits gas flow from the processing zone to the pumping annulus 163. In an alternative implementation, the floor 106 may be electrically isolated from the pedestal base plate 118 by an insulating ring 220, the ring 220 being an optional feature in the embodiment of FIG. 7. This can prevent RF ground return current flow from the floor 106 to the grounded base 118 of the pedestal 108. In accordance with one embodiment, the conductive sidewall conducts ground return currents from the plasma to the baffle 260. For this purpose, the baffle 260 is electrically coupled to the sidewall. In one embodiment, this is accomplished without requiring mechanical contact between the baffle 260 and the side wall 102, by a low impedance capacitively coupled path from the conductive sidewall 102 to the baffle 260. This feature permits up and down movement of the workpiece support pedestal 108 without metal-on-metal friction, to prevent contamination. The capacitive coupling from the sidewall 102 to the baffle 260 is implemented in the embodiment of FIG. 7 by a conductive axial flange 280 supported on the peripheral edge of the baffle 260 and a conductive axial flange 285 supported on a conductive ledge 287 on the interior surface of the side wall 102. The axial flanges 280, 285 face one another across a sufficiently small gap 290 to provide very low impedance capacitive coupling at the frequency of either the RF generator 119 or the RF generator 40. As a result, RF ground return current flows from the plasma inside the chamber 100 to the sidewall 102 and from there to the baffle 260 and from the baffle to the ground pedestal base 118. The ring insulator 220 prevents RF ground return current flow from the sidewall 102 to the grounded pedestal base 118. In this way, RF ground return current distribution does not flow past the slit valve 128 and does not flow past the pumping port 162, so as to be unaffected by the presence of the pumping port 163 and by the presence of the slit valve 128.

The baffle 260 is coupled to the sidewall 102 via the closely spaced flanges 280, 285 at a location above the slit valve 128. In one embodiment, the slit valve 128 is in a portion of the sidewall 102 that is below the level of the baffle 260. RF ground return current from the plasma to the sidewall 102 flows downwardly along the sidewall 102 but is pulled off (diverted) to the baffle 260 across the flange-to-flange gap 290 and therefore does not, generally, flow through the sidewall 102 below the level of the baffle 260. In one embodiment, the RF ground return current does not flow through the lower annular section of the sidewall 102 that contains the slit valve 128. As a result, the coupling across the gap 290 of the baffle 260 to the sidewall 102 prevents RF ground return current from reaching the slit valve 128. The present embodiment prevents or reduces the tendency of the slit valve 128 to create an azimuthal skew in the RF ground return current distribution.

Figure 9:
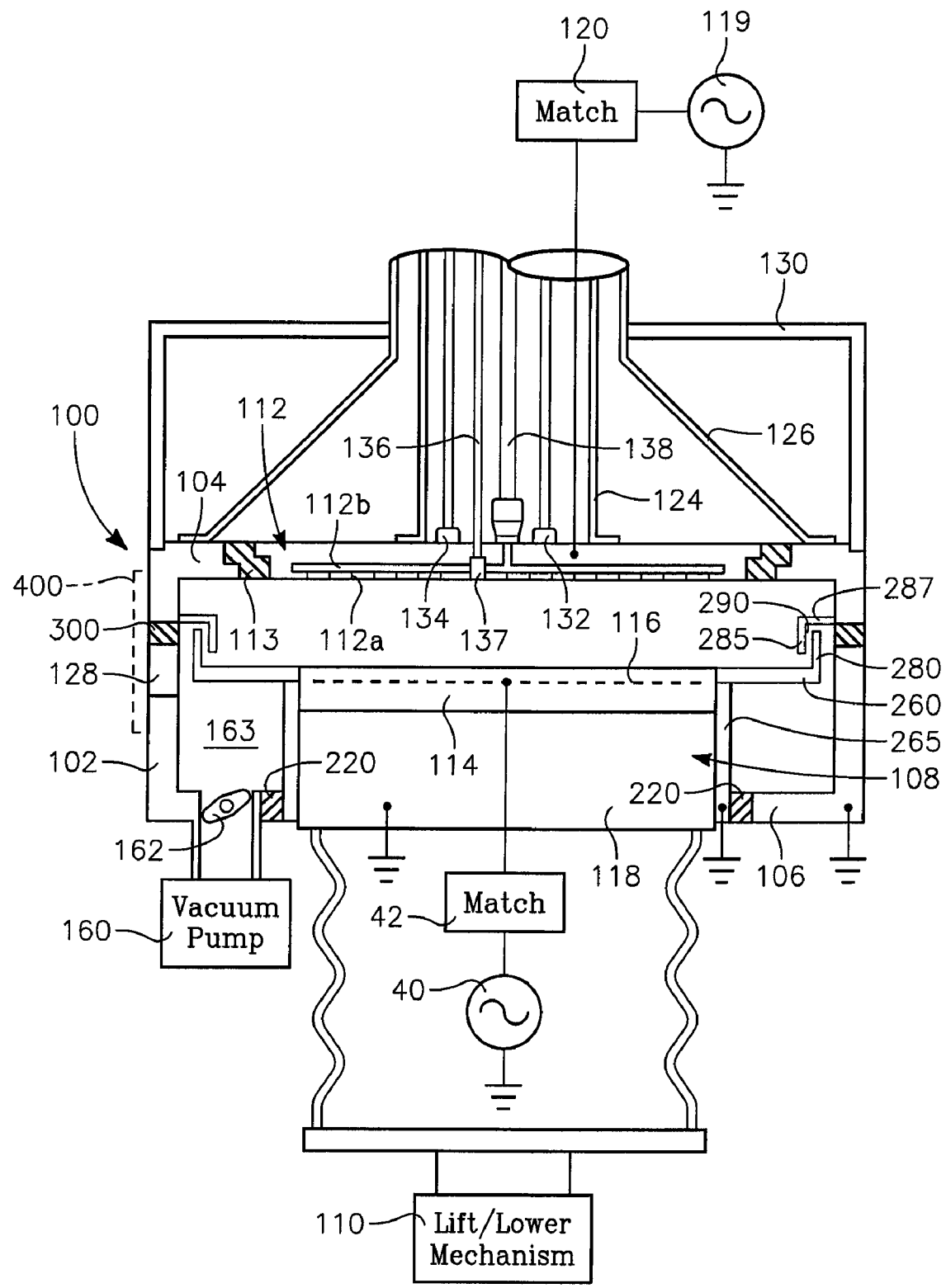
FIG. 9 illustrates a modification of the embodiment of FIG. 7 in which a dielectric ring is provided in the side wall.

The tendencies to create an azimuthal skew in the RF ground may be further suppressed by installing a dielectric ring 300 above the slit valve 128 as depicted in FIG. 9. The presence of the dielectric ring 300 prevents RF ground return currents flowing downwardly along the sidewall 102 from reaching the discontinuity presented by the slit valve 128. The dielectric ring 300 prevents such discontinuity from affecting the RF ground return current distribution. Preventing the slit valve discontinuity from affecting the current distribution prevents it from affecting the electric field at the workpiece and prevents skew or non-uniformities in the plasma processing.

While the foregoing is directed to embodiments of the invention, other and further embodiments of the invention may be devised without departing from the basic scope thereof, and the scope thereof is determined by the claims that follow.

What is claimed is:

1. A plasma reactor comprising:
a vacuum chamber having a cylindrical side wall, a ceiling and a floor;
a workpiece support pedestal in said chamber defining a pumping annulus between said pedestal and said side wall, said workpiece support pedestal comprising a grounded surface adjacent said floor;
an RF power applicator, and a process zone defined between said ceiling and said pedestal;
a pumping port through said floor;
a dielectric element between said grounded surface of said pedestal and said floor;
an annular conductive grill in said pumping annulus and displaced above said floor by a grill-to-floor gap, and providing a current path from said side wall to said grounded surface of said pedestal, said grill being generally symmetrical relative to an axis of symmetry of said chamber;
a slit valve opening through a circumferential portion of said cylindrical side wall, said slit valve opening being axially confined within an annular section of said cylindrical side wall;
at least a first dielectric circular ring in said cylindrical side wall adjacent an axial boundary of said annular section of said side wall; and
an array of conductive straps providing axial current paths bypassing said annular section of said cylindrical side wall, each of said conductive straps having a pair of ends, one end being electrically connected to said side wall above said annular section and the other end being electrically connected to said side wall below said annular section, said straps being routed to avoid blocking access to said slit valve opening.

2. The reactor of claim 1 wherein said grill comprises a circular periphery and grill elements extending across an area defined by said circular periphery.

3. The reactor of claim 2 wherein said grill elements comprises intersecting linear conductive elements.

4. The reactor of claim 3 wherein said grill elements comprise radial spokes.

5. The reactor of claim 4 wherein said grill further comprises a center hub, said radial spokes extending from said hub to said circular periphery.

6. The reactor of claim 1 wherein said pedestal extends through a center opening in said floor, said grounded surface of said pedestal comprising an outer cylindrical surface of said pedestal facing an edge of said floor defined by said center opening.

7. The reactor of claim 1 wherein said pedestal further comprises a grounded base layer coupled to said surface, said surface being grounded to said base layer.

8. The reactor of claim 1 wherein said RF power applicator comprises an overhead electrode in said ceiling, said reactor further comprising a dielectric ring between said overhead electrode and said ceiling.

9. The reactor of claim 8 wherein said ceiling is grounded through said sidewall and said sidewall is grounded through said grill and said grill is grounded through said grounded surface of said pedestal.

10. The reactor of claim 1 wherein said RF power applicator comprises a cathode electrode in said pedestal.

11. The reactor of claim 1 wherein said RF power applicator comprises a coil antenna.

12. The reactor of claim 1 further comprising:
a conductive hollow cylindrical can extending upwardly from said ceiling; and
plural external facility lines extending axially through an interior of said can to said RF power applicator.

13. The reactor of claim 12 wherein said RF power applicator comprises an overhead electrode having gas distribution injection elements and coolant passages, said plural external facility lines comprising a process gas supply line coupled to said gas distribution injection elements, a coolant inlet line, a coolant outlet line and an optical sensor signal-carrying line.

14. The reactor of claim 1 further comprising:
a second dielectric ring in said cylindrical side wall, said first dielectric ring being adjacent a top axial boundary of said annular section of said side wall and said second dielectric ring being adjacent a bottom axial boundary of said annular section of said side wall.

15. The reactor of claim 1 wherein said straps are periodically spaced around the circumference of said side wall at uniform intervals.

16. The reactor of claim 15 wherein said straps are configured to provide uniform inductances to RF current.

17. The reactor of claim 16 wherein straps adjacent said slit valve are of a sufficient length to permit routing around a periphery of said slit valve, while the remaining straps are of a shorter length.

18. The reactor of claim 1 wherein said straps are spaced from one another along the circumference of said side wall by an azimuthal distance that is less than an axial distance between a wafer support surface of said pedestal and said plural straps.

19. The reactor of claim 18 wherein said azimuthal distance is less than said axial distance by at least a factor of three.

* * * * *